(12) United States Patent
Kim et al.

(10) Patent No.: US 6,934,161 B2
(45) Date of Patent: Aug. 23, 2005

(54) PCI CARD RETAINING DEVICE WITH INTEGRATED AIRFLOW GUIDE

(75) Inventors: David Kwang Jae Kim, San Jose, CA (US); Talal J. Ahwal, Santa Cruz, CA (US); Kenneth Kitlas, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 254 days.

(21) Appl. No.: 10/262,287

(22) Filed: Sep. 30, 2002

(65) Prior Publication Data

US 2004/0062013 A1 Apr. 1, 2004

(51) Int. Cl.[7] .............................. H05K 5/00; H05K 5/04; H05K 5/06
(52) U.S. Cl. ..................... 361/752; 361/800; 361/797; 361/695
(58) Field of Search ................................ 361/752, 797, 361/790, 695, 800, 736, 676, 693, 692, 690, 683, 756

(56) References Cited

U.S. PATENT DOCUMENTS

| | | | | |
|---|---|---|---|---|
| 5,734,551 A | * | 3/1998 | Hileman et al. | 361/695 |
| 5,822,193 A | * | 10/1998 | Summers et al. | 361/759 |
| 6,297,957 B1 | * | 10/2001 | Johnson et al. | 361/687 |
| 2003/0021088 A1 | * | 1/2003 | Jensen et al. | 361/687 |

* cited by examiner

Primary Examiner—Kamand Cuneo
Assistant Examiner—Hung S. Bui
(74) Attorney, Agent, or Firm—Blakely Sokoloff Taylor & Zafman LLP (57) ABSTRACT

According to one embodiment, a computer system is disclosed. The computer system includes a circuit board, and connectors mounted on the circuit board. Each connector supports a peripheral component interface (PCI) card. In addition, the computer system includes a shroud that encloses the connectors in order to separate the associated PCBs from other components on the circuit board.

16 Claims, 9 Drawing Sheets

PCI CARD RETAINING DEVICE WITH INTEGRATED AIRFLOW GUIDE

FIELD OF THE INVENTION

The present invention relates to computer systems; more particularly, the present invention relates to thermal management on computer system motherboards.

BACKGROUND

A computer system motherboard is a physical arrangement in a computer that contains a computer system's basic circuitry and components. On the typical motherboard, the circuitry is imprinted or affixed to the surface of a firm planar surface and usually manufactured in a single step.

Computer system motherboards are typically manufactured with a microprocessor, memory, basic input/output system (BIOS) and interconnecting circuitry. In addition, computer system motherboards often include at least one Peripheral Component Interface (PCI) connector that include a PCI expansion card in order to increase the capacity of the computer system. A computer enclosure PCI panel is formed with an opening for the insertion and withdrawal of the PCI cards.

As computer systems including plug in PCI cards increase in power and performance, and while package size decreases, the need to dissipate excess heat generated by the PCI cards becomes both more essential. Thus, the problem of effective temperature control has become a major industry concern. In addition, as PCI cards become more powerful, the mass of the cards increases. As the mass increases, it becomes more difficult to hold a particular PCI card in its connector on the motherboard.

Therefore, a mechanism to hold PCI connectors, and a thermal management mechanism for PCI connectors on a motherboard is desired.

SUMMARY

According to one embodiment, a circuit board is disclosed. The circuit board includes one or more connectors to support printed circuit boards (PCBs), a shroud to enclose the connectors in order to separate the associated PCBs from other components on the circuit board, and a cooling fan mounted on the shroud. In a further embodiment, the shroud guides air generated by the cooling fan to control thermal energy generated by the PCBs.

In yet a further embodiment, a card retaining assembly is mounted on the shroud. The card retaining assembly includes a housing having one or more cavities mounted on the shroud, one or more holders that are inserted into the one or more cavities in order to support the PCBs, and one or more caps mounted on the holders that prevent the holders from being withdrawn from the housing.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A housing with Peripheral Component Interface (PCI) connectors is described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
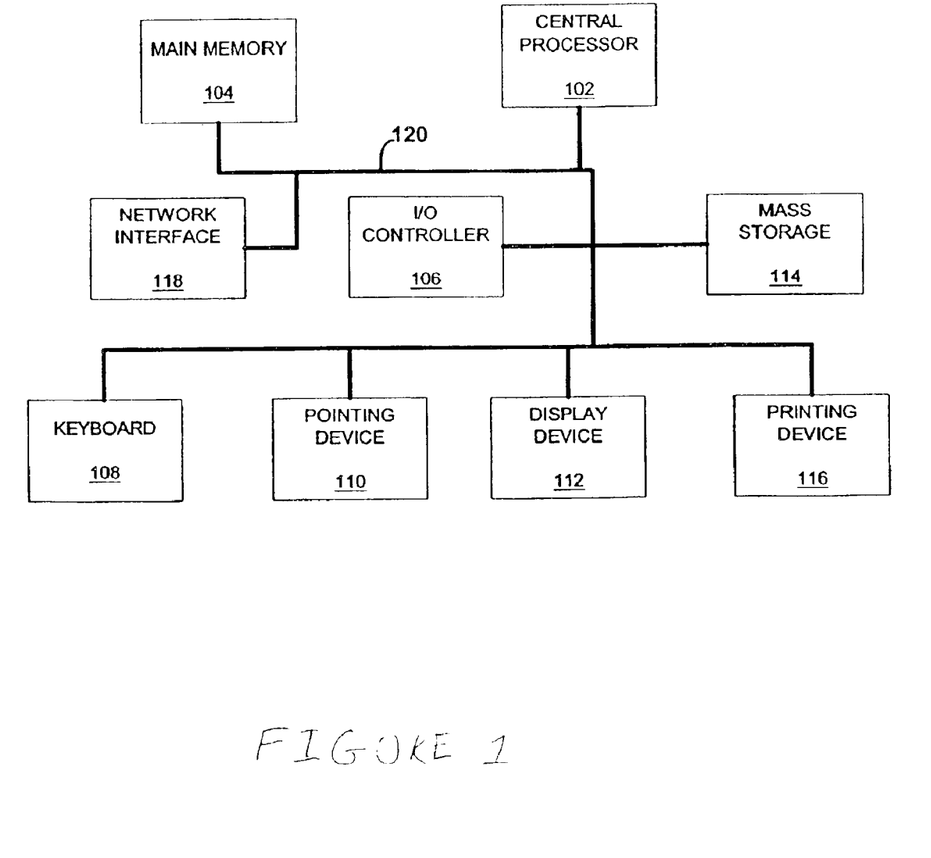
FIG. 1 illustrates one embodiment of a computer system.

FIG. 1 illustrates one embodiment of a computer system 100 in which the present invention may be embodied. Computer system 100 comprises a central processor 102, a main memory 104, an input/output (I/O) controller 106, a keyboard 108, a pointing device 110 (e.g., mouse, track ball, pen device, or the like), a display device 112, a mass storage 114 (e.g., a nonvolatile storage such as a hard disk, an optical drive, and the like), and a network interface 118. Additional input/output devices, such as a printing device 116, may be included in the system 100 as desired. As illustrated, the various components of the system 100 communicate through a system bus 120 or similar architecture.

In an embodiment, the computer system 100 includes a Sun Microsystems computer utilizing a SPARC microprocessor available from several vendors (including Sun Microsystems of Palo Alto, Calif.). Those with ordinary skill in the art understand, however, that any type of computer system may be utilized to embody the present invention, including those made by Hewlett Packard of Palo Alto, Calif., and IBM-compatible personal computers utilizing Intel microprocessor, which are available from several vendors (including IBM of Armonk, N.Y.).

Also, instead of a single processor, two or more processors (whether on a single chip or on separate chips) can be utilized to provide speedup in operations. It is further envisioned that the processor 102 may be a complex instruction set computer (CISC) microprocessor, a reduced instruction set computing (RISC) microprocessor, a very long instruction word (VLIW) microprocessor, a processor implementing a combination of instruction sets, and the like.

The network interface 118 provides communication capability with other computer systems on a same local network, on a different network connected via modems and the like to the present network, or to other computers across the Internet. In various embodiments, the network interface 118 can be implemented utilizing technologies including, but not limited to, Ethernet, Fast Ethernet, wide-area network (WAN), leased line (such as T1, T3, optical carrier 3 (OC3), and the like), analog modem, digital subscriber line (DSL and its varieties such as high bit-rate DSL (HDSL), integrated services digital network DSL (IDSL), and the like), cellular, time division multiplexing (TDM), universal serial bus (USB and its varieties such as USB II), asynchronous transfer mode (ATM), satellite, cable modem, and/or FireWire.

Moreover, the computer system 100 may utilize operating systems such as Solaris, Windows (and its varieties such as CE, NT, 2000, XP, ME, and the like), HP-UX, IBM-AIX, PALM, UNIX, Berkeley software distribution (BSD) UNIX, Linux, Apple UNIX (AUX), Macintosh operating system (Mac OS) (including Mac OS X), and the like. Also, it is envisioned that in certain embodiments, the computer system 100 is a general purpose computer capable of running any number of applications such as those available from companies including Oracle, Siebel, Unisys, Microsoft, and the like.

Figure 2:
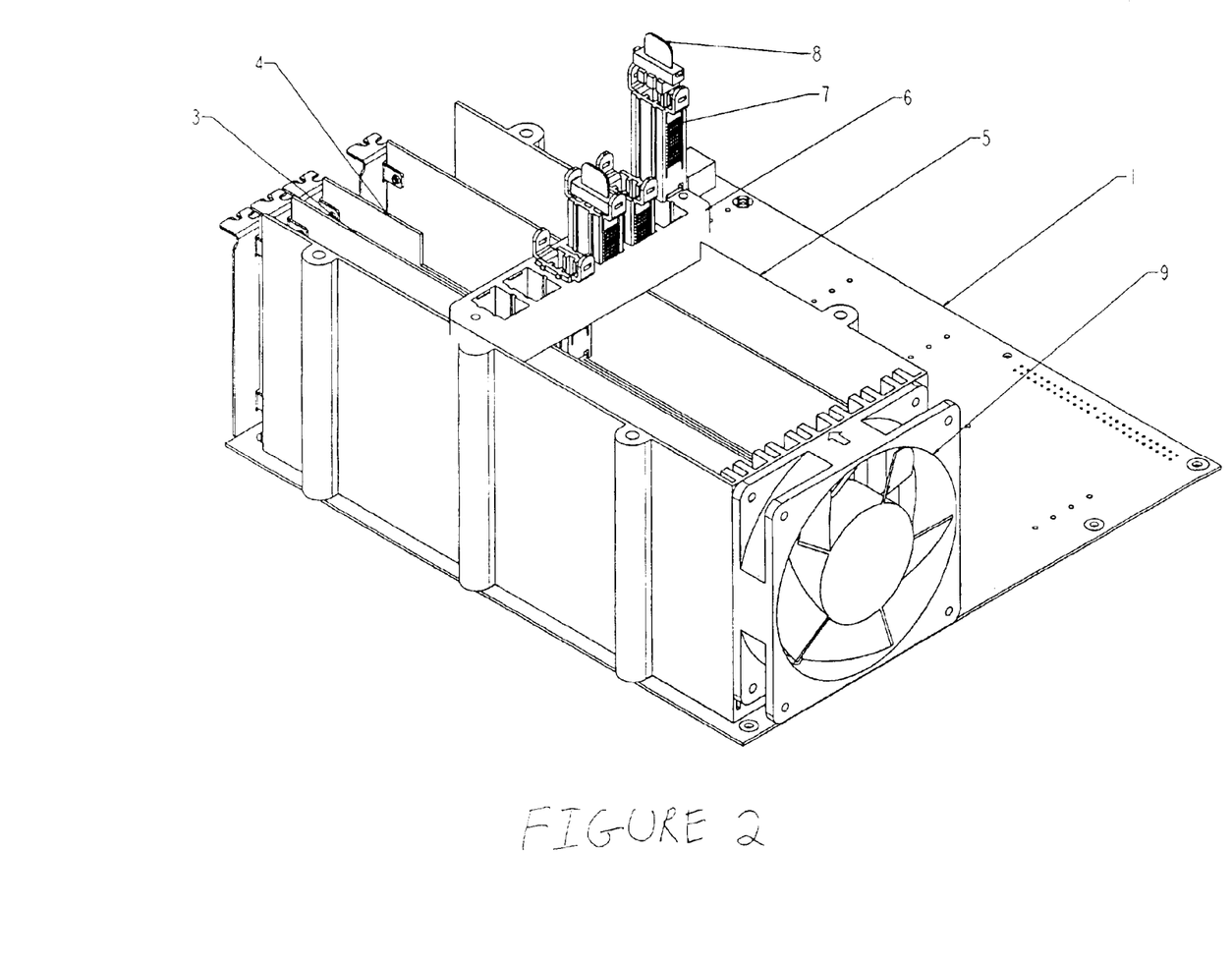
FIG. 2 illustrates one embodiment of a motherboard.

FIG. 2 illustrates one embodiment of a motherboard 1. Motherboard 1 is a physical arrangement in a computer system that includes the computer system's basic circuitry and components. Motherboard 1 includes PCI cards 3 and 4, shroud 5, a housing 6 and cooling fan 9. PCI cards 3 and 4 are printed circuit boards (PCBs) that connect with a PCI bus in computer system 100.

The PCI bus facilitates an interconnection between central processor 102 and devices on the PCI cards. As shown in FIG. 2, cards 3 and 4 may have different sizes (e.g., height and length). According to one embodiment, PCB stiffeners may be added to the top of the PCI cards. A stiffener is a metal bar that straightens a PCI board.

Shroud 5 is mounted on motherboard 1. According to one embodiment, shroud 5 is an enclosure that separates the PCI cards from other components on motherboard 1 in order to control thermal energy. In a further embodiment, shroud 5 includes vent openings that enable airflow from cooling fan 9. Thus, shroud 5 operates as an airflow guide that directs air directly to PCI cards 2 and 3. Housing 6 is a component of the PCI card retaining assembly that includes one or more card holders 7, and associated caps 8.

Figure 3:
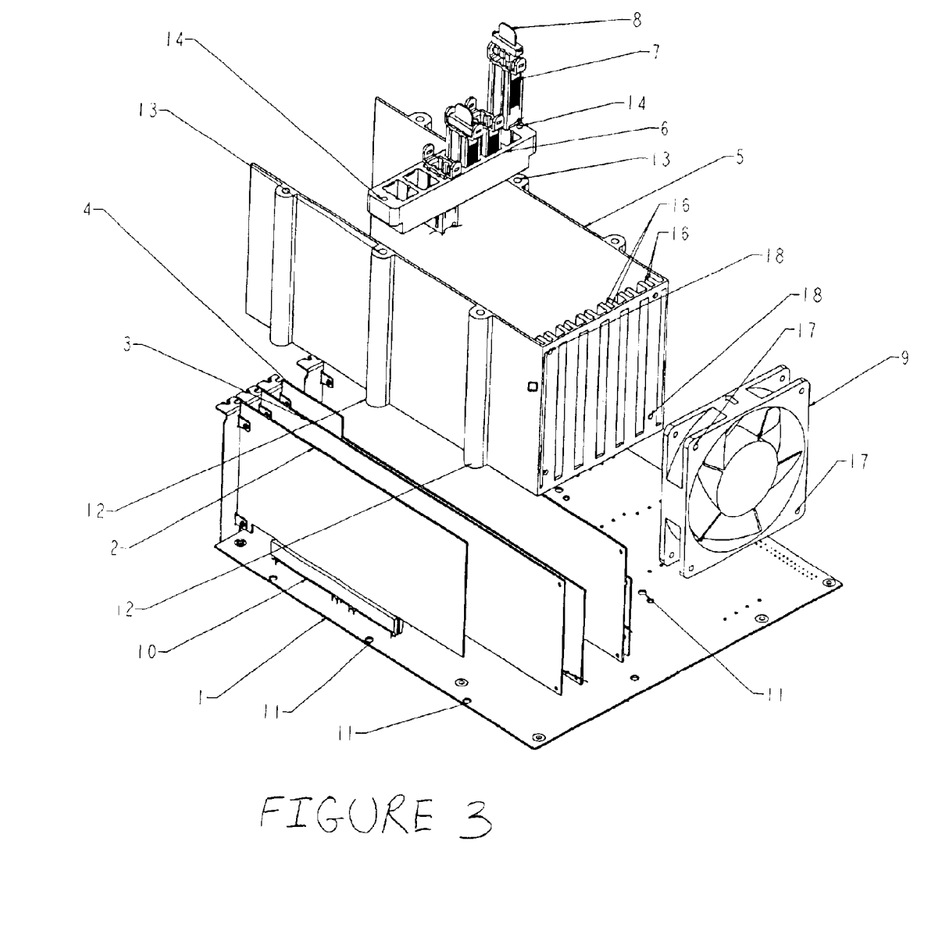
FIG. 3 illustrates an exploded view of one embodiment of a motherboard.

FIG. 3 illustrates an exploded view of one embodiment of motherboard 1. FIG. 3 shows card connectors 10 mounted to motherboard 1 that are used to connect PCI cards 2, 3 and 4 to the electrical circuitry of motherboard 1. According to one embodiment, shroud 5 includes fasteners 12 that couples shroud 5 to motherboard 1 via fasteners 11 on motherboard 1. In a further embodiment, shroud 5 includes fasteners 18 that couples shroud 5 to cooling fan 9 via fasteners 17 on cooling fan 9. However, in other embodiments, shroud 5 may be coupled to motherboard 1 and cooling fan 9 via a snap method.

In one embodiment, shroud 5 includes card guides 16. Guides 16 support and guide PCI cards into connectors 10 during the insertion of the PCI cards. The card retaining assembly 7 and 8 within holder 6 assist in the guiding of PCI cards into connectors 10. Shroud 5 includes fasteners 13 that couples shroud 5 to housing 6 via fasteners 14 on housing 6.

Figure 4:
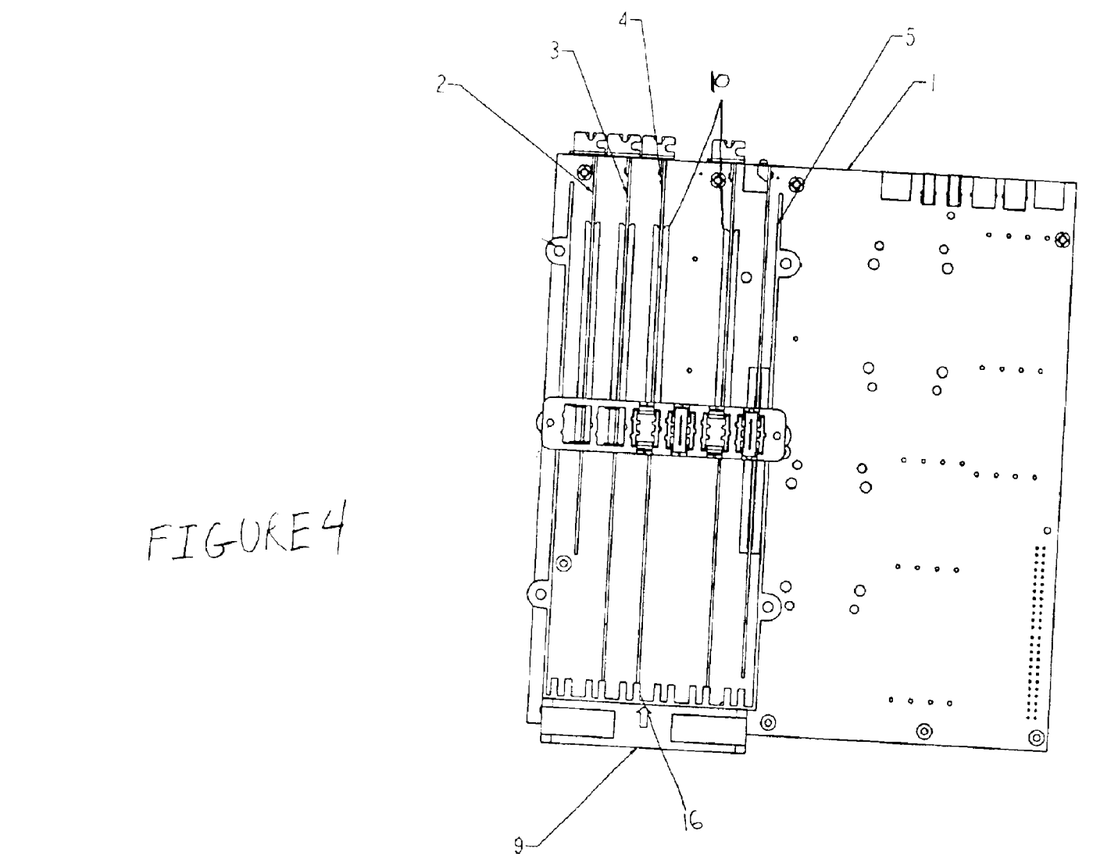
FIG. 4 illustrates a side view of one embodiment of a motherboard.

FIG. 4 illustrates a side view of one embodiment of motherboard 1. In this view, shroud 5 is shown mounted to motherboard 1. In addition, cooling fan 9, housing 6 and the associated card retaining assembly is mounted on shroud 5

Figure 5:
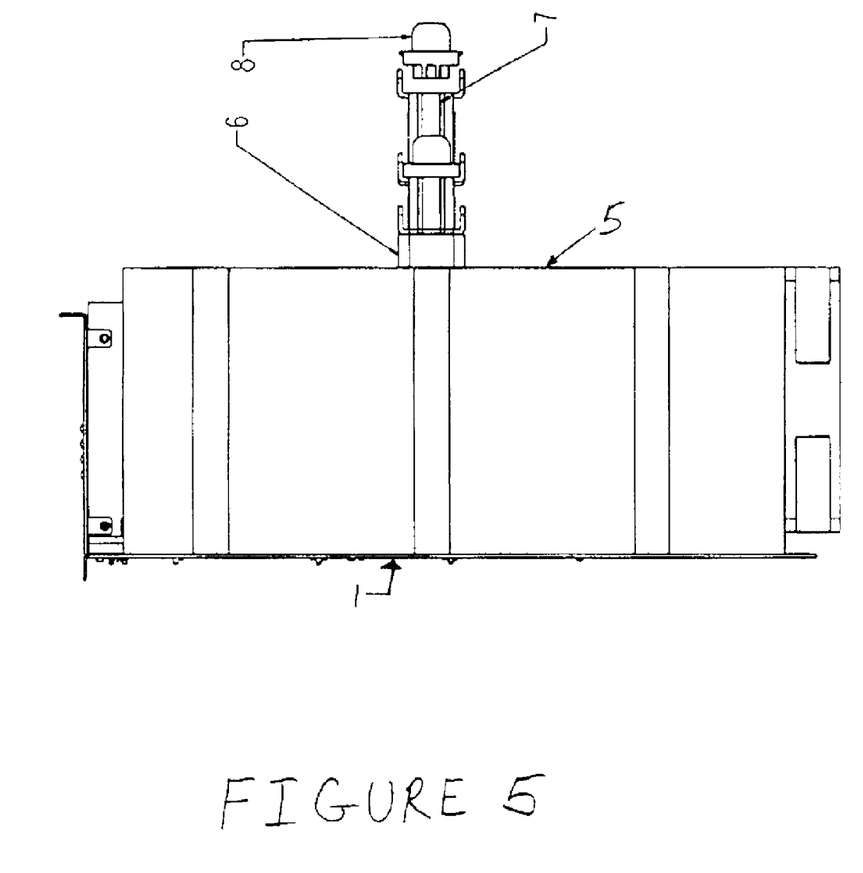
FIG. 5 illustrates a top view of one embodiment of a motherboard.

FIG. 5 illustrates a top view of one embodiment of motherboard 1. FIG. 5 shows shroud 5 enclosing the PCI cards inserted within connectors 10, and located within the grooves of guides 16. Moreover, a holder 7 of the card retaining assembly is shown affixed to each PCI card inserted into a connector 10. As described above, shroud 5 guides airflow generated by fan 9 to the PCI cards in order to control the temperature from heat generated by the PCI cards.

Figure 6:
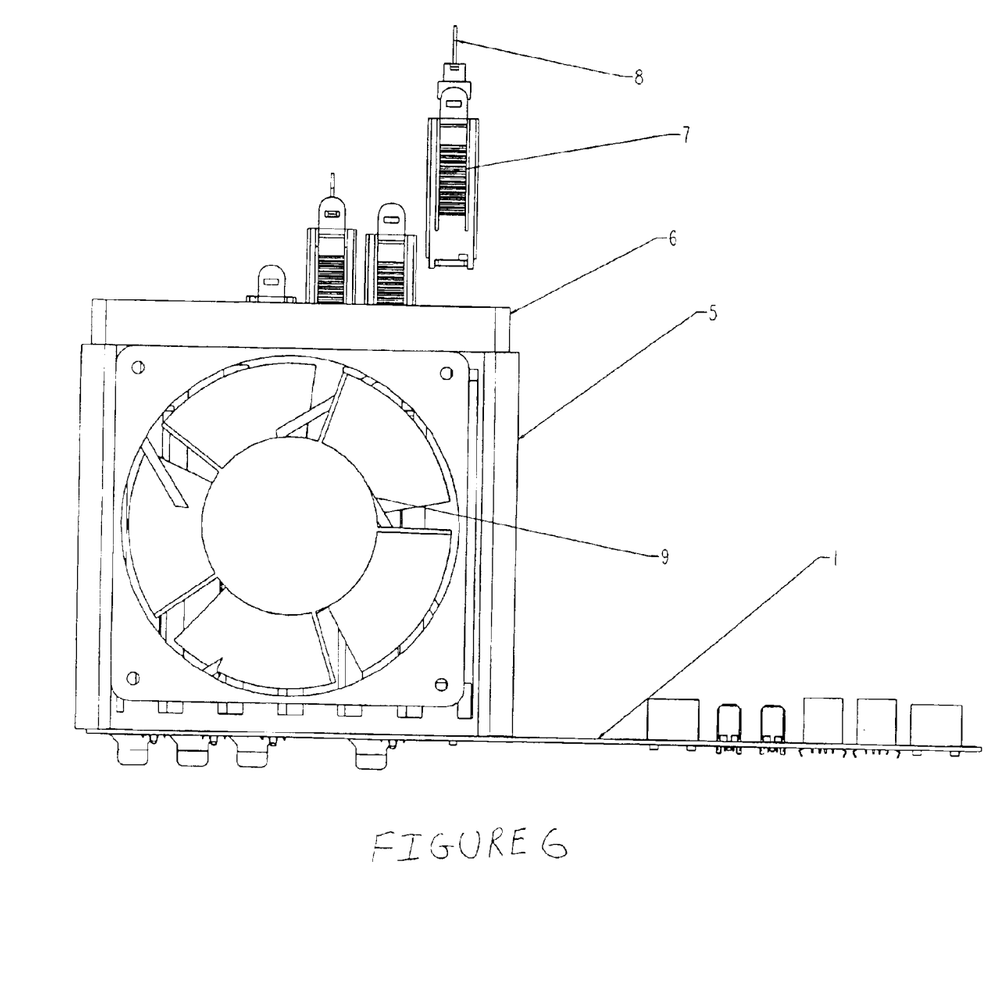
FIG. 6 illustrates another side view of one embodiment of a motherboard.
Figure 7:
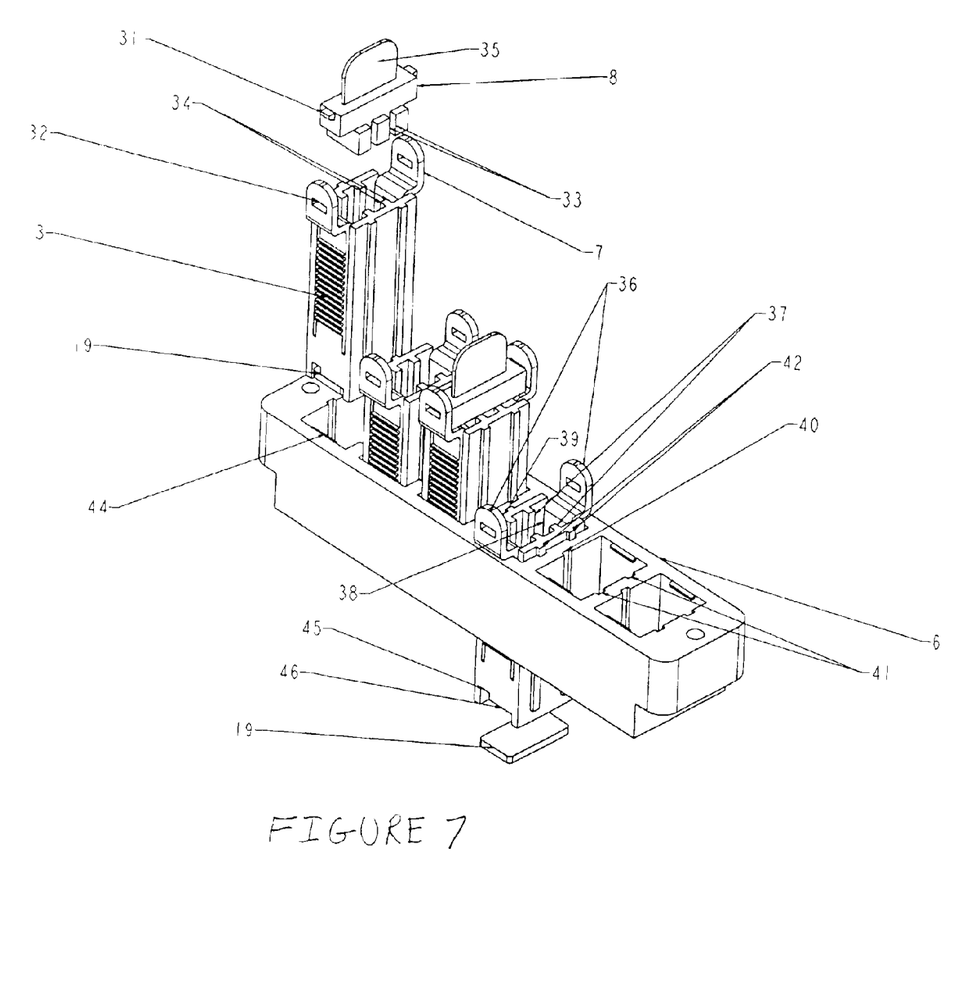
FIG. 7 illustrates one embodiment of a housing.
Figure 8:
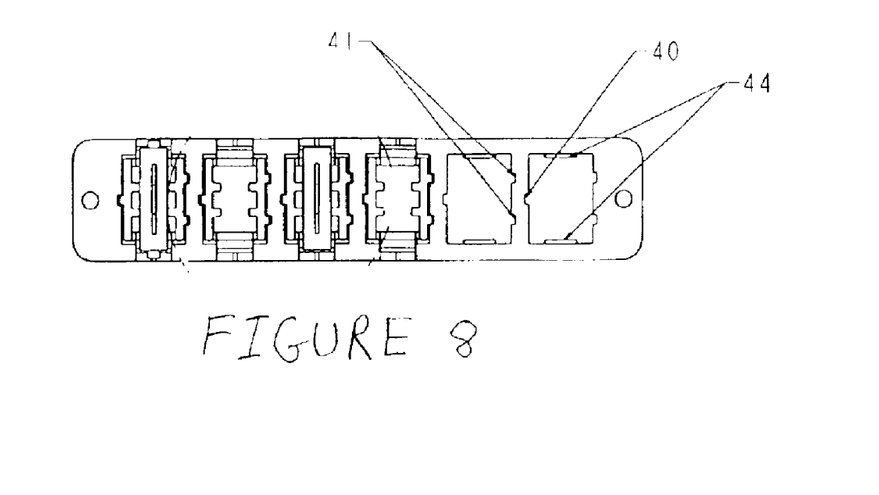
FIG. 8 illustrates a top view of one embodiment of a housing.

FIG. 6 illustrates another side view of one embodiment of a motherboard 1 in which holders 7 and a cap 8 of the card retaining assembly is shown in detail with respect to shroud 5 housing 6 and fan 9. FIG. 7 illustrates one embodiment of housing 6 with a more detailed view of holders 7 and other components of the card retaining assembly. The PCI card retaining assembly includes housing 6, holders 7, foam 19 and caps 8. Housing 6 includes cavities 40 with a positive latch 44 on both sides of each cavity 40. In addition, each cavity 40 includes key slots 41. FIG. 8 illustrates a top view of one embodiment of housing 6 with cavities 40;

Referring back to FIG. 7, each holder 7 has a built in snap feature. The snap feature includes a series of positive latches 43 on holder 7 that operate in conjunction with latches 44 in a cavity 40 for the insertion and removal of holder 7 from housing 6. Each holder 7 also includes squeeze clamp 36. Clamp 36 may be squeezed with the fingers of a user to remove a holder 7 from housing 6. In one embodiment, each holder 7 includes a pair of ribs 37 that prevent over squeezing of clamp 36.

Figure 9:
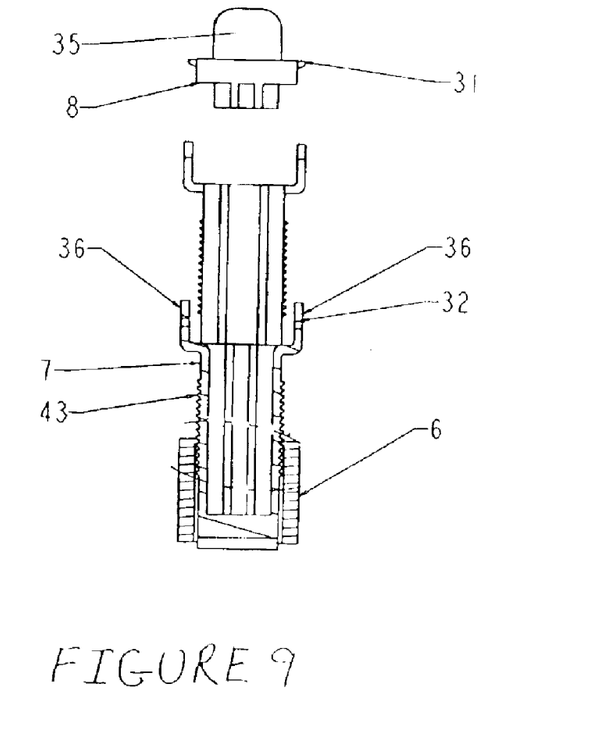
FIG. 9 illustrates an exploded view of one embodiment of a holder.

Cap 8 may be snapped on to a holder 7 using a snap 31. Meanwhile, holder 7 includes gaps 32 within clamp 36 to accommodate snap 31. According to one embodiment, the snap 31/gap 32 assembly at the top of a holder 7 prevents holder 7 from backing out from housing 6. In addition, cap 8 includes a pull tab 35 that facilitates the removal of holder 7 from housing 6. FIG. 9 illustrates an exploded view of one embodiment of holder 7.

Figure 10:
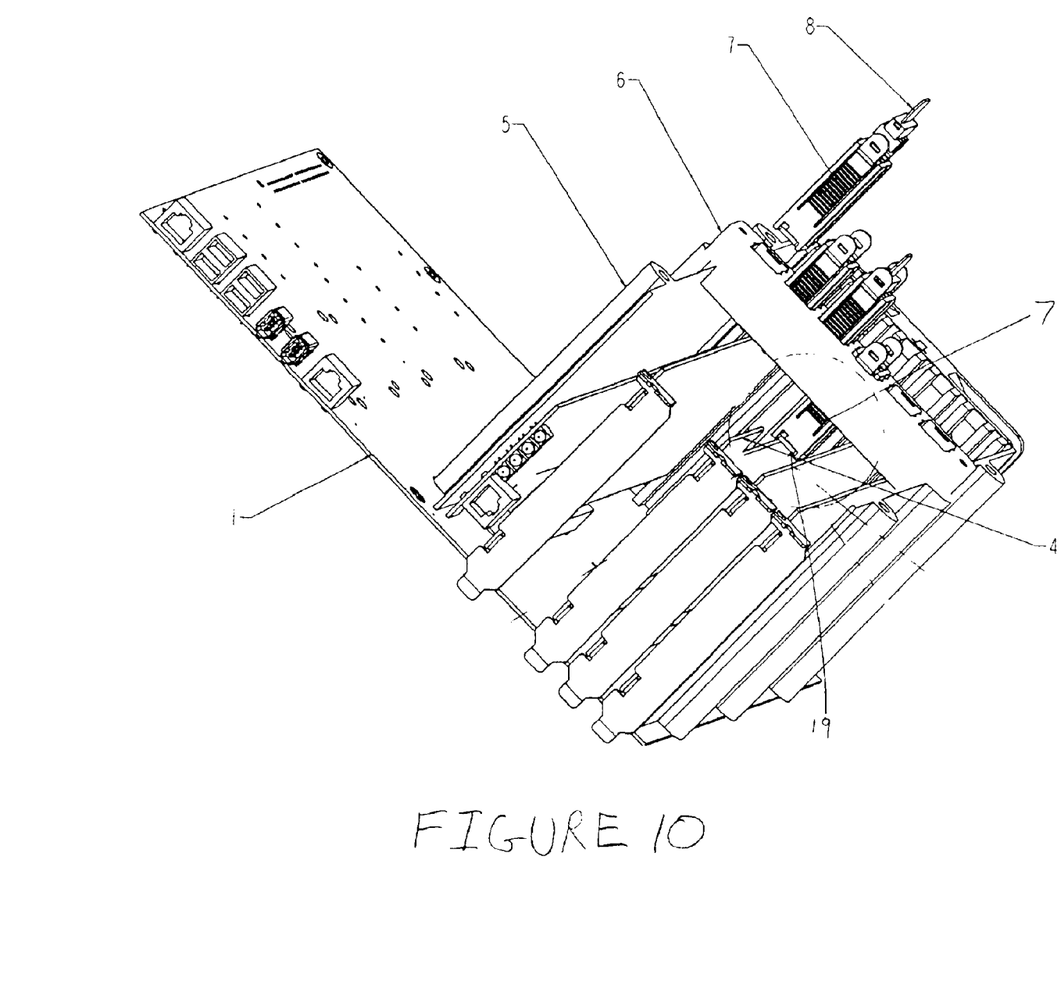
FIG. 10 illustrates a rotated view of one embodiment of a motherboard.

Referring back to FIG. 7, holder 7 includes slots 45 and 46 that are used to rest on the top of the PCI cards (e.g., 2, 3 and 4). The slots 45 and 46 guard and support a PCI card. Foam 19 is inserted within the gap of slot 46 and presses down on the top of the PCI cards. In addition, foam 19 accommodates any possible mechanical tolerance accumulations between the PCI card and holder 7. FIG. 10 illustrates a rotated view of one embodiment of motherboard 1 showing the slot 45 and 46, and foam 19 attachment to the PCI card.

Referring back to FIG. 7, when inserting a PCI card, a holder 7 can slide up and down inside of the housing 6 cavity. Thus, the PCI card retaining device assembly enables holder 7 to adjust to match the height of any particular PCI card (e.g., 2, 3 and 4). For example, the higher the height of a PCI card, a lower latch 43 is used to engaged with latch 44. Subsequently, cap 8 is inserted in the to the back of the holder 7 to prevent holder 7 from backing out of the housing 6.

The shroud described above enables the management of thermal energy generated by PCI cards. In addition, the shroud provides for easy insertion of PCI cards by implementing card guides. The card retaining assembly provides a mechanism to insert and remove PCI cards without the use of tools, while having the ability to adjust to the height and length of all sizes of PCI cards.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

What is claimed is:

1. A circuit board comprising:
   one or more connectors each configured to support a printed circuit board (PCB);
   a shroud to enclose the one or more connectors in order to separate the PCBs from other components on the circuit board;
   a cooling fan mounted on the shroud, wherein the shroud guides air generated by the cooling fan to control thermal energy generated by the PCBs; and
   a card retaining assembly mounted on the shroud, including:
      a housing, mounted on the shroud, having one or more cavities;
      one or more holders configured to be inserted into the one or more cavities in order to support the PCBs; and
      one or more caps, mounted on the holders, to prevent the holders from being withdrawn from the housing.

2. The circuit board of claim 1 wherein the shroud includes guides that guide the PCBs into the associated connectors and support the PCBs once inserted into the connectors.

3. The circuit board of claim 1 wherein each cavity includes one or more key slots.

4. The circuit board of claim 1 wherein each holder is configured to slide within the housing to accommodate PCBs having variable heights.

5. The circuit board of claim 1 wherein the housing includes a latch located next to each cavity.

6. The circuit board of claim 5 wherein each holder includes a plurality of latches configured to engage with a latch on the housing in order to fix the position of a holder.

7. The circuit board of claim 6 wherein each holder includes a clamp to disengage with the latch on the housing in order to move the holder.

8. The circuit board of claim 1 wherein the PCBs are peripheral component interface (PCI) cards.

9. The circuit board of claim 7 wherein each holder includes ribs to prevent the clamp from being squeezed beyond a predetermined threshold.

10. A computer system comprising:
    a circuit board;
    one or more connectors, mounted on the circuit board, each configured to support a peripheral component interface (PCI) card;
    a shroud to enclose the one or more connectors in order to separate the PCI cards from other components on the circuit board; and
    a card retaining assembly mounted on the shroud, including:
       a housing, mounted on the shroud, having one or more cavities;
       one or more holders configured to be inserted into the one or more cavities in order to support the PCI cards; and
       one or more caps, mounted on the holders, to prevent the holders from being withdrawn from the housing.

11. The computer system of claim 10 further comprising a cooling fan mounted on the shroud.

12. The computer system of claim 11 wherein the shroud guides air generated by the cooling fan to control thermal energy generated by the PCBs.

13. The computer system of claim 10 further comprising:
    a central processing unit (CPU) mounted on the circuit board; and
    a memory device mounted on the circuit board.

14. The computer system of claim 10 wherein the shroud includes guides that guide the PCBs into the associated connectors and support the PCBs once inserted into the connectors.

15. The computer system of claim 10 wherein each holder is configured to slide within the housing to accommodate PCI cards of variable heights.

16. The computer system of claim 10 wherein each of the one or more holders includes one or more latches to engage the housing when inserted into the one or more cavities.

* * * * *